United States Patent [19]

Kamizato et al.

[11] Patent Number: 5,642,373

[45] Date of Patent: Jun. 24, 1997

[54] MONOLITHIC SEMICONDUCTOR LASER ARRAY OF RADIALLY DISPOSED LASERS

[75] Inventors: Takeshi Kamizato; Ryoichi Hirano, both of Itami, Japan

[73] Assignee: Mitsubishi Denki Kabushiki Kaisha, Tokyo, Japan

[21] Appl. No.: 550,119

[22] Filed: Oct. 30, 1995

[30] Foreign Application Priority Data

Nov. 7, 1994 [JP] Japan .................................. 6-272352

[51] Int. Cl.$^6$ .................................................. H01S 3/19
[52] U.S. Cl. ........................... 372/50; 372/75; 257/88; 257/98
[58] Field of Search ........................ 372/50, 75, 108, 372/43; 257/88, 98

[56] References Cited

U.S. PATENT DOCUMENTS

| | | | |
|---|---|---|---|
| 4,179,635 | 12/1979 | Yeh | 372/50 |
| 4,881,237 | 11/1989 | Donnelly | 372/50 |
| 5,001,719 | 3/1991 | Trussell | 372/50 |
| 5,012,477 | 4/1991 | Mesquida et al. | 372/50 |
| 5,365,533 | 11/1994 | Groussin | 372/50 |
| 5,373,173 | 12/1994 | Ohata et al. | 372/50 |

FOREIGN PATENT DOCUMENTS

| | | | |
|---|---|---|---|
| 56-134792 | 10/1981 | Japan | 372/43 |
| 3257888 | 11/1991 | Japan . | |
| 690063 | 3/1994 | Japan . | |

OTHER PUBLICATIONS

Strite et al., "Progress and Prospects for GaN and the III–V Nitride Semiconductors", Thin Solid Films, vol. 231, pp. 197–210 (no publication month available) 1993.

*Primary Examiner*—Rodney B. Bovernick
*Assistant Examiner*—Luong-Quyen T. Phan
*Attorney, Agent, or Firm*—Leydig, Voit & Mayer

[57] ABSTRACT

A monolithic semiconductor laser array includes an insulating substrate, a plurality of semiconductor layers epitaxially grown on the substrate and forming a laser structure, and at least one groove transverse to the substrate extending through the semiconductor layers into the substrate, dividing the semiconductor laser structure into at least two mutually isolated parts. Within each of the isolated parts of the semiconductor laser structure, a first groove includes a side wall transverse to the substrate and forming a first resonator facet of a semiconductor laser. A second groove in each of the parts includes a second side wall transverse to the substrate and opposite the first side wall, forming a second resonator facet of the semiconductor laser in that part. Each second groove also includes a third side wall oblique to the substrate and opposite the second side wall for reflecting light from the respective semiconductor laser so that light from each of the semiconductor lasers is emitted along a common axis transverse to the substrate. The second grooves are arranged radially about a common point on the substrate. The semiconductor lasers may be electrically connected in series to each other.

2 Claims, 10 Drawing Sheets

MONOLITHIC SEMICONDUCTOR LASER ARRAY OF RADIALLY DISPOSED LASERS

FIELD OF THE INVENTION

The present invention relates to a semiconductor laser device and, more particularly, to a high power output semiconductor laser device which can be produced easily with a high yield.

BACKGROUND OF THE INVENTION

As to a high power output semiconductor laser device, how to improve the optical output is of particular importance, but today a method of increasing the optical output includes assembling a plurality of semiconductor lasers in stacked fashion.

FIG. 9 is a view showing the conventional high output semiconductor laser device described in, for instance, Japanese Published Patent Application No. Hei 6-90063.

This high output semiconductor laser device is made by first putting two semiconductor laser chips 108 one upon another and then assembling them in stacked fashion by soldering them together by means of a solder 108a. The semiconductor laser chip 108 is made by growing on an $n^+$ type GaAs substrate 181 an n type $Al_xGa_{1-x}As$ cladding layer 182, an undoped GaAs active layer 183, a p type $Al_xGa_{1-x}As$ cladding layer 184, and a $p^+$ type GaAs contact layer 185, successively, and forming a p side electrode 187 via an insulation layer 186 for current confinement on the contact layer 185, and an n side electrode 188 on the rear surface of the substrate 181.

When such a 2-chip laminated type semiconductor laser device is pulse driven under conditions of 50 ns in pulse width, 0.025% in pulse duty ratio and 25 amperes in input current, 30 W is obtained as the peak output power. The number of stages of semiconductor laser chips 108 may not necessarily be two as mentioned above, and it may as well be three or more and today even a semiconductor laser device laminating at maximum six chips and having a peak output of 100 W is on the market.

FIG. 10 is a perspective view showing a prior art surface light emission semiconductor laser which enables an optical output high in intensity and narrow in beam radiation angle, FIG. 11(a) a sectional view taken along line 11a—11a of FIG. 10 and FIG. 11(b) a partial sectional view taken along line 11b—11b of FIG. 10.

In the figures there are formed on an n type InP substrate 201 an n-type InGaAsP waveguide layer 202 having a composition producing a band gap energy corresponding to a wavelength of about 1.3 µm, an undoped InGaAsP active layer 203 having a composition producing a band gap energy corresponding to a wavelength of about 1.55 µm, a p type InP cladding layer 204, and a p type InGaAsP cap layer 205, laminated successively. These layers 202–205 can be grown by LPE (liquid phase epitaxy), MO-VPE (metal organic vapor phase epitaxy), MBE (molecular beam epitaxy) or the like. On the rear surface of the substrate 201 there is provided an n side electrode 206, and a p side electrode 207 is provided on the cap layer 205.

The resonator is constituted by the facets 208a and 208b formed by cleavage or etching and on the facets 208a and 208b there are formed a metal film 210 or dielectric film via an insulating film 209, resulting in high reflection facets. The metal film 210 surrounds the active layer 203 in a ring shape. A ring shaped diffraction grating 211 for optical output provided in the laser resonator enables emission of light perpendicular to the surface of the substrate. The diffraction grating has a secondary order with a period of about 5,000 angstroms (500 nm). The diameter of the ring shaped diffraction grating 211 is about 50 µm–200 µm. Excessive loss of light, other than by emitted light, is avoidable by forming the ring shaped diffraction grating 211 on the exposed low loss waveguide layer 202 after removing the active layer 203 and the like in a circle in the central portion of the laser resonator. Light emission by the ring shaped diffraction grating 211 is performed in the direction perpendicular to the diffraction grating formation surface but it is possible to obtain all optical output from above the diffraction grating formation surface by making the n side electrode 206 a reflection film or by providing a separate high reflection film thereunder.

The feature of this prior art device also resides in that it is possible to obtain the optical output from a plurality of laser resonators through one aperture by making the diffraction grating ring shaped and arranging a plurality of stripe configuration laser resonators radially. That is, the ring shaped diffraction grating 211 is provided at the center of the device, and four stripe configuration laser resonators 220, 221, 222 and 223 are arranged radially, traversing the ring shaped diffraction grating 211. The width of each laser resonator is 1–2 µm for lateral mode control and its periphery is buried by, for example, a semi-insulating InP layer 212 as shown in FIG. 11(b), whereby leakage current is suppressed. Since in such a construction the output from each laser resonator is emitted upward from only the ring shaped diffraction grating 211, it is possible to obtain a high output in proportion to the number of laser resonators through a single aperture.

Since, as mentioned above, the high output semiconductor laser device shown in FIG. 9 has a plurality of semiconductor laser chips laminated by soldering, there were problems that a fault occurred in the light emission pattern due to insufficient lamination precision and that the laser chip was destroyed by thermal damage in the laser chip adhering step, resulting in difficulty in obtaining a high yield. Further, there was a problem of increased labor cost in the laser chip stacking process. In addition, this problem became more serious upon increasing the number of laser chips adhered together for still higher laser output.

The high output semiconductor laser device shown in FIG. 10 is structured such that light is taken out perpendicular to the substrate by means of a diffraction grating. Since in this case only the light of wavelength causing Bragg reflection in the diffraction grating is taken out, the optical output obtainable is only several percent of the optical output of the Fabry-Perot type laser device, resulting in difficulty in providing a high output semiconductor laser device required for a laser radar. Still other problems are complexity and increased cost due to formation of a diffraction grating with high precision.

SUMMARY OF THE INVENTION

It is an object of the present invention to provide a high power output semiconductor laser device that is easily fabricated.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a semiconductor laser device includes a plurality of semiconductor laser elements having a pair of opposite resonator facets from which a laser beam is emitted, a plurality of reflecting mirrors for reflecting a laser beam emitted from the semiconductor laser element, disposed on the optical axis of the laser beam emitted by the plurality of semiconductor laser elements. The plurality of semiconductor laser elements and the plurality of reflecting mirrors are disposed so that the individual laser beams reflected by the plurality of reflecting mirrors which are in close proximity to one another are reflected in the same direction. Therefore, the respective laser beams emitted from the plurality of semiconductor laser elements are converged and emitted with high output.

According to a second aspect of the present invention, the semiconductor laser device includes a semiconductor laminated structure grown laminatedly a portion of which forms the semiconductor laser element and the reflecting mirror formed by processing other portion of the semiconductor laminated structure into an inclined face. Therefore, the reflecting mirrors are formed with the semiconductor laser element.

According to a third aspect of the present invention, the semiconductor laser device includes resonator facets of the semiconductor laser element formed by sidewalls positioned at the opposite sides of a pair of opposing grooves formed by etching the semiconductor laminated structure grown laminatedly perpendicular to the laminated surface and, the reflecting mirror comprises a surface formed by etching a sidewall opposite to the sidewall of the resonator facet of one of the pair of grooves to be inclined with respect to the optical axis of the laser emission beam. Therefore, the reflecting mirrors are easily formed on the optical axis of the laser emission beam of the resonator facet.

According to a fourth aspect of the present invention, the semiconductor laser device includes the plurality of reflecting mirrors being disposed separate from the plurality of semiconductor laser elements, and each of the reflecting mirrors being made of a plurality of side faces of a polygonal pyramidal member except the base. Therefore, the distance between the plurality of the semiconductor laser element and the plurality of the reflecting mirrors depends on the configuration and the mounting place of the device.

DETAILED DESCRIPTION OF THE PREFERRED EMBODIMENTS

Embodiment 1

Figure 1:
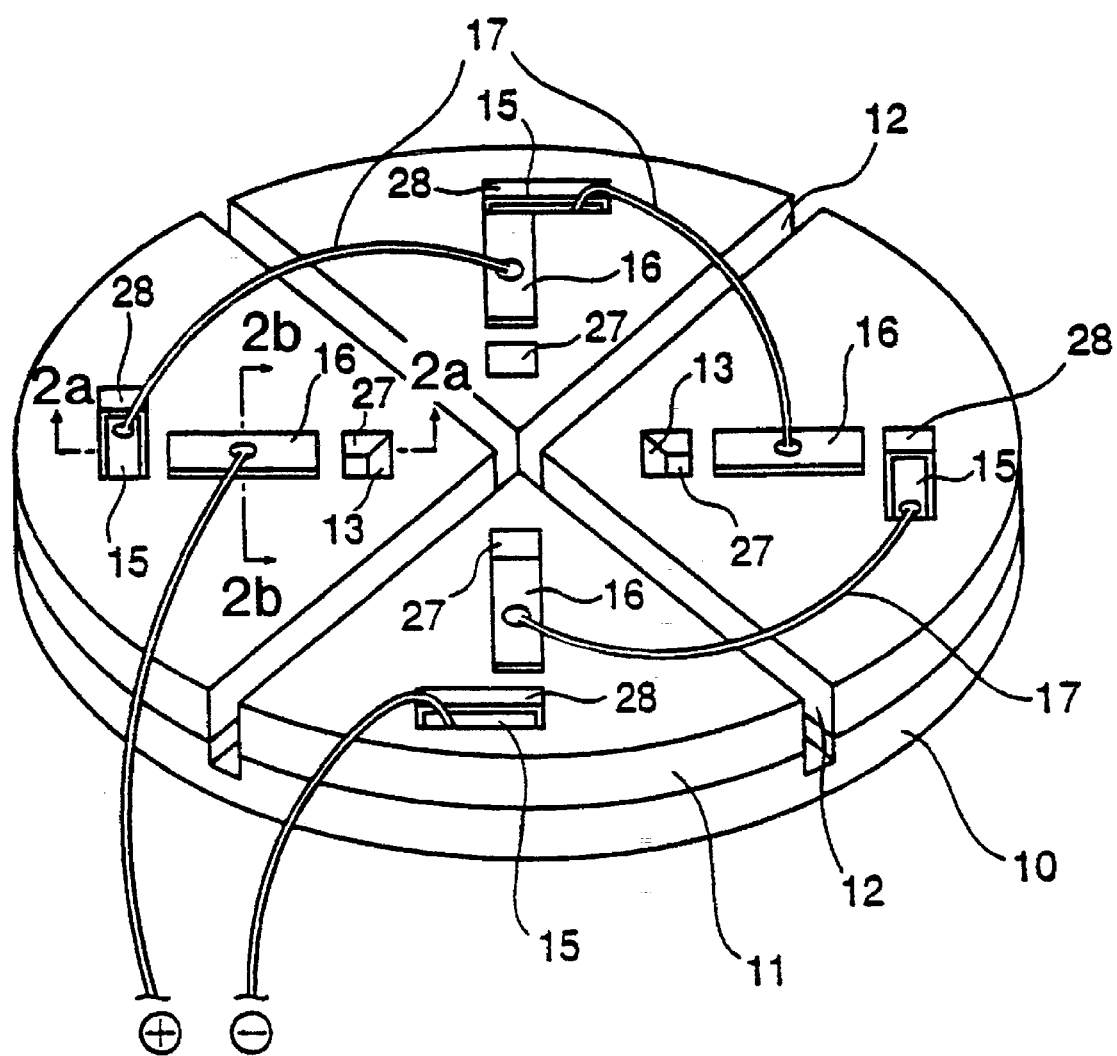
FIG. 1 is a perspective view showing a high output semiconductor laser device in accordance with a first embodiment of the present invention.

FIG. 1 is a perspective view showing a high power output semiconductor laser device in accordance with a first embodiment of the present invention, FIG. 2(a) is a partial sectional view taken along line 2a—2a of FIG. 1 and FIG. 2(b) is another sectional view taken along line 2b—2b of FIG. 1.

Figure 2:
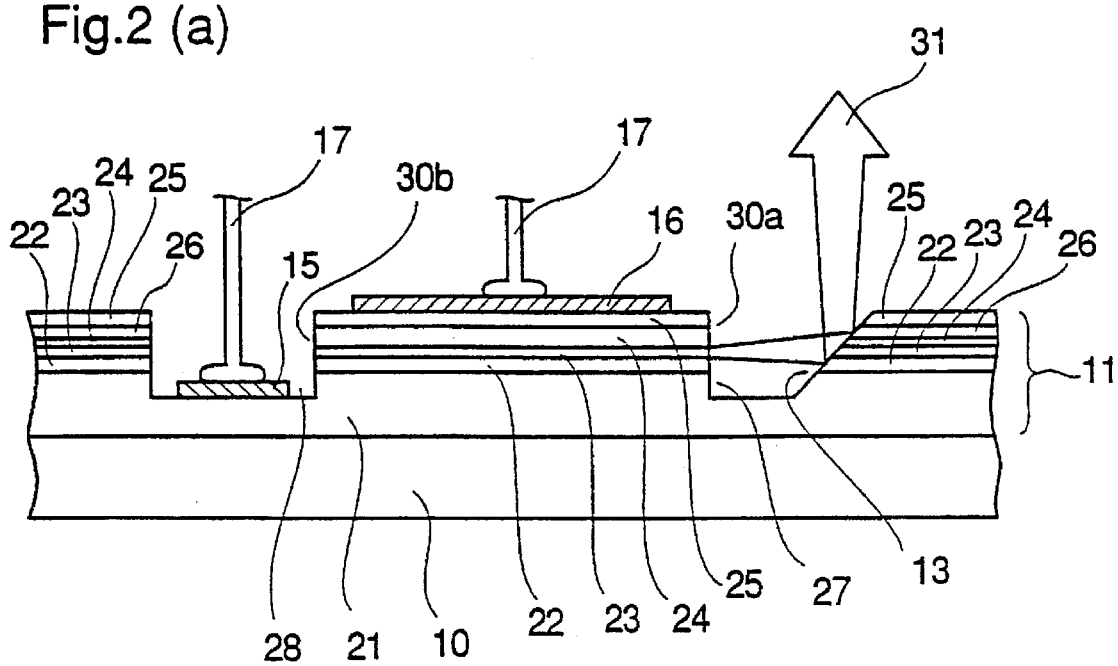
FIGS. 2(a)-2(b) are sectional views taken along lines 2a—2a and 2b—2b of FIG. 1 respectively.
Figure 2:
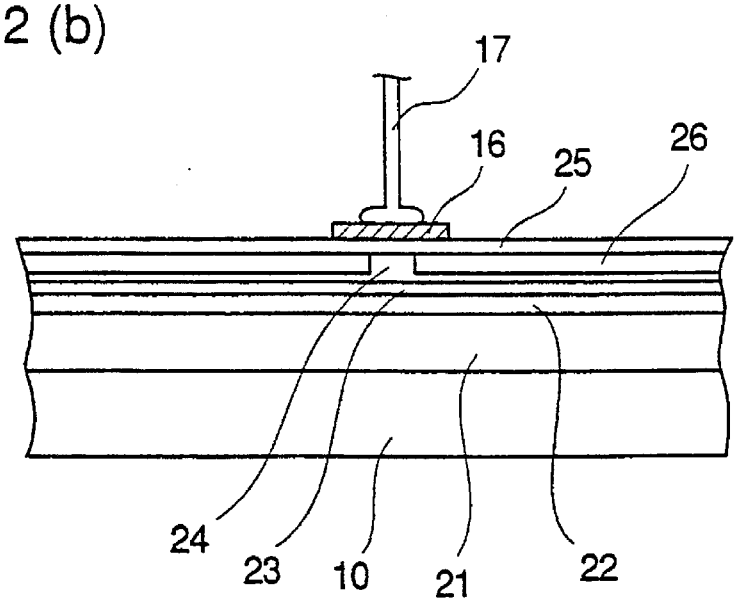

In these figures reference numeral 10 designates an insulating substrate about 90 μm thick. Reference numeral 11 designates an epitaxial growth layer having a laminated laser structure, grown on the insulating substrate 10. The epitaxial growth layer 11 comprises, as shown in FIG. 2, an n type GaAs layer 21 50 μm thick, an n type AlGaAs lower cladding layer 22 3 μm thick, an AlGaAs active layer 23 10 nm (100 Å) thick, a p type AlGaAs upper cladding layer 24 3 μm thick, a p type GaAs contact layer 25 1 μm thick, and an n type GaAs current blocking layer 26 for forming a current confinement structure. The epitaxial growth layer 11 is divided into four parts by insulating separation grooves 12 reaching the substrate 10. Each part of the epitaxial growth layer 11 has formed therein at predetermined positions grooves 27 and 28 reaching the n type GaAs layer 21. In the region between these grooves 27 and 28 there is formed a laser resonator structure including resonator facets 30a and 30b. The length of the resonator is, for example, 600 μm. The sidewall opposite to the resonator facet 30a of the groove 27 is inclined at 45° relative to the plane of the substrate 10, as a laser beam reflecting surface 13 which reflects a laser beam 31 emitted from the facet 30a in the direction perpendicular to the substrate 10. Reference numeral 15 designates an n side electrode 20 μm thick deposited on the bottom of the groove 28 and reference numeral 16 designates a p side electrode 20 μm thick deposited on the contact layer 25. Reference numeral 17 designates wires bonded to and connecting the n side electrode and the p side electrode of adjacent lasers. Thus, in this embodiment serial connection of individual laser elements as in the stacked semiconductor laser device is realized by connecting the n side electrode and the p side electrode of adjacent lasers with the wire 17.

Figure 3:
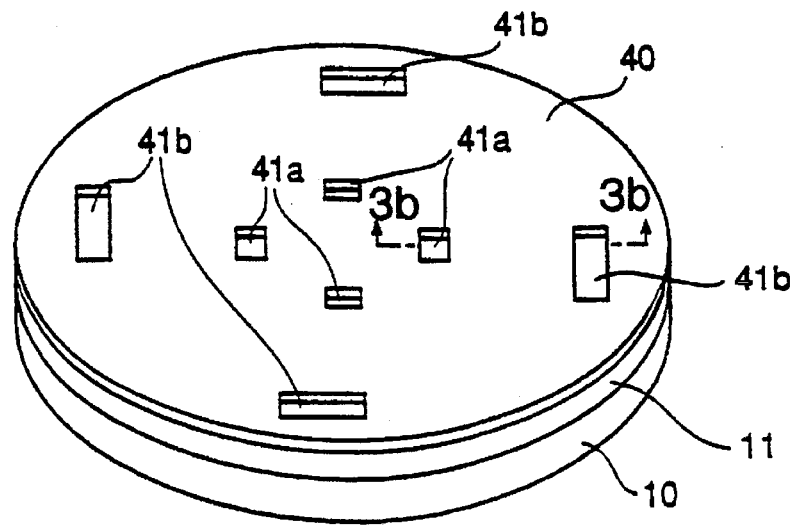
FIGS. 3(a)-3(d) are diagrams showing a part of the manufacturing process for the high output semiconductor laser device shown in FIG. 1.
Figure 3:
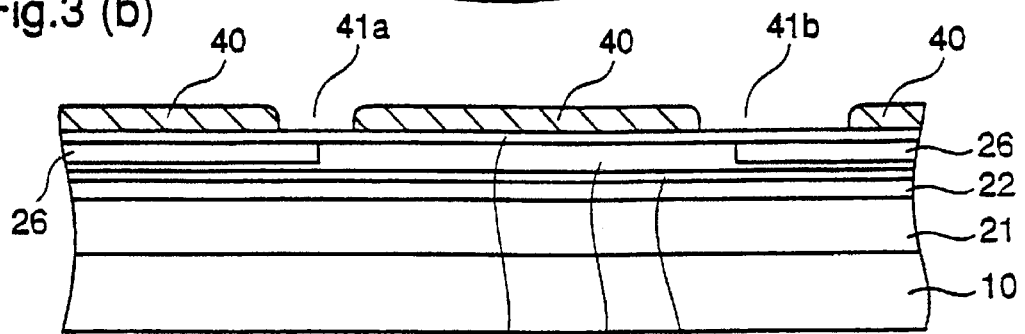
Figure 3:
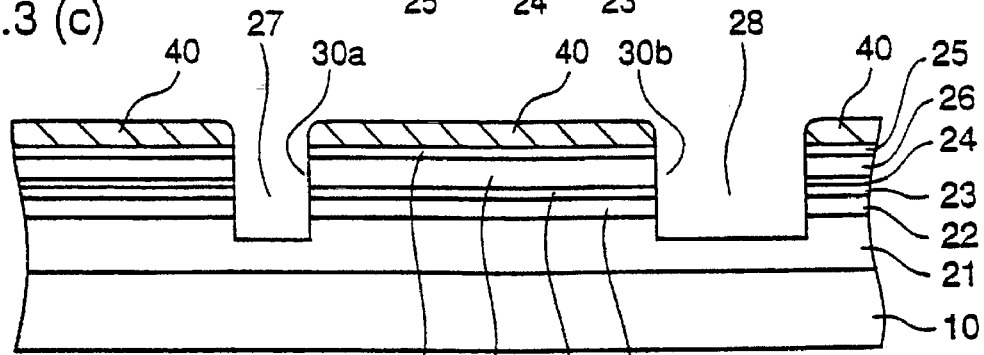
Figure 3:
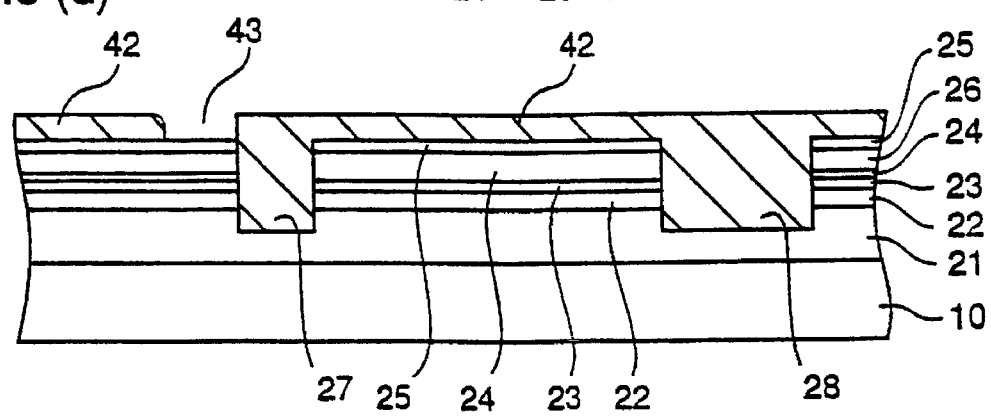

Then, the manufacturing process for the high output semiconductor laser device of embodiment 1 will be described. After forming the epitaxial growth layer 11 having a laminated laser structure comprising the n type GaAs layer 21, the n type AlGaAs lower cladding layer 22, the AlGaAs active layer 23, p type AlGaAs upper cladding layer 24, the p type GaAs contact layer 25 and n type GaAs current blocking layer 26 on the insulating substrate 10, a first resist 40 is applied on the entire wafer and openings 41a and 41b are formed on the resist 40 by transfer exposure as shown in FIG. 3(a). FIG. 3(b) is a partial sectional view taken along line 3b—3b of the drawing 3(a). With this patterned resist 40 as mask, dry etching is carried out with a chlorine-based gas as etchant gas and, as shown in FIG. 3(c), a pair of laser resonator facets 30a and 30b are formed. Here, the depth of the groove is such that the n type GaAs layer 21 is reached. The laser resonator facets 30a and 30b are formed as flat as possible.

Figure 4:
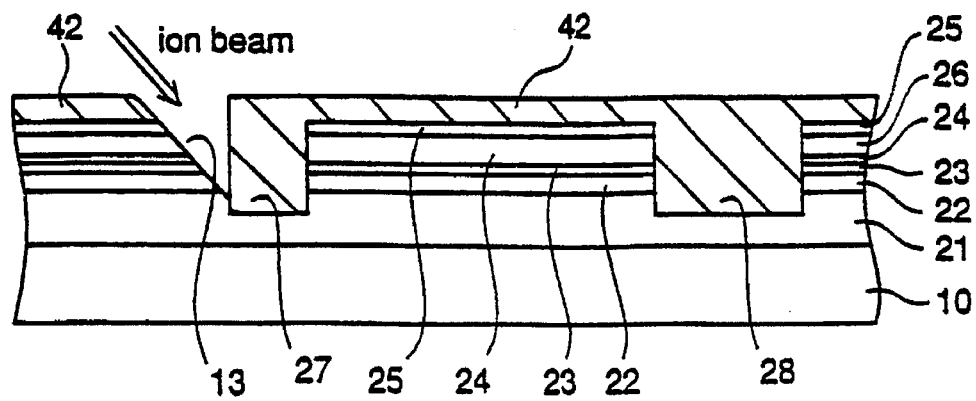
FIGS. 4(a)-4(d) are diagrams showing a part of the manufacturing process for the high output semiconductor laser device shown in FIG. 1.
Figure 4:
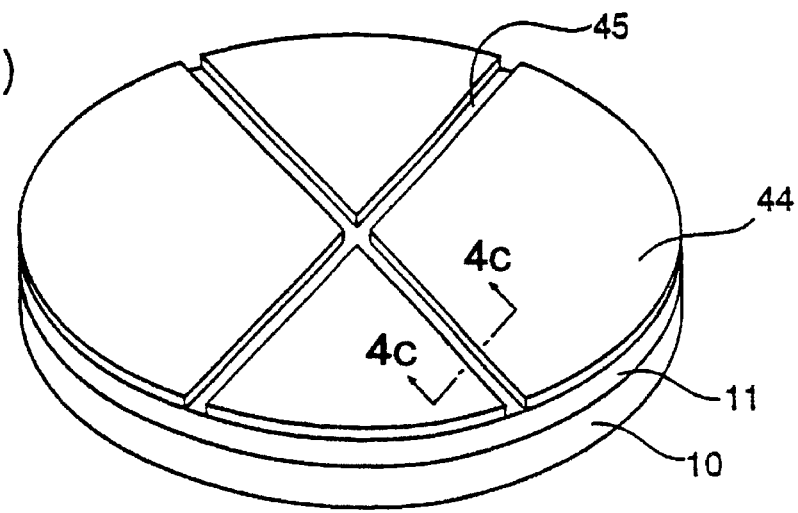
Figure 4:
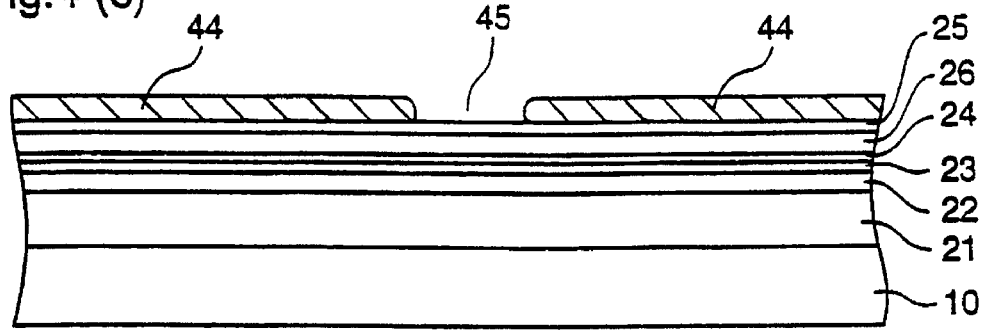
Figure 4:
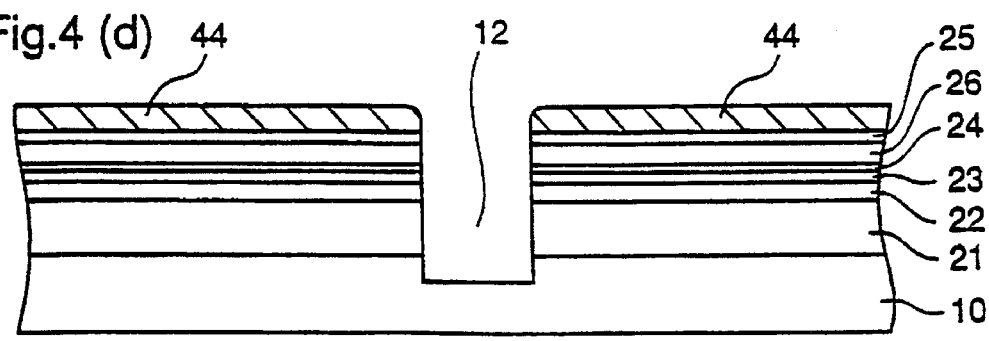

After removal of the resist 40 a second resist 42 is applied on the entire wafer and beside the groove 27 formed for formation of the laser resonator facets there is formed an opening 43 as shown in FIG. 3(d). Then, etching using such as a focused ion beam is performed with the beam being applied locally and diagonally. The light reflecting surface 13 is formed by the etching as shown in FIG. 4(a). The light reflecting surface 13 is formed so that its angle with the surface of the substrate is 45°.

After removal of the second resist 42, a third resist 44 is applied on the entire wafer and then, as shown in FIG. 4(b), windows 45 are formed in the resist 44 by transfer exposure. FIG. 4(c) is a sectional view taken along line 4c—4c of FIG. 4(b). Then, with this patterned resist 44 as mask and with chlorine-based gas as an etchant insulating separating grooves 12 are formed in the wafer with their depth reaching a little beyond the insulating substrate 10 as shown in FIG. 4(d).

Figure 5:
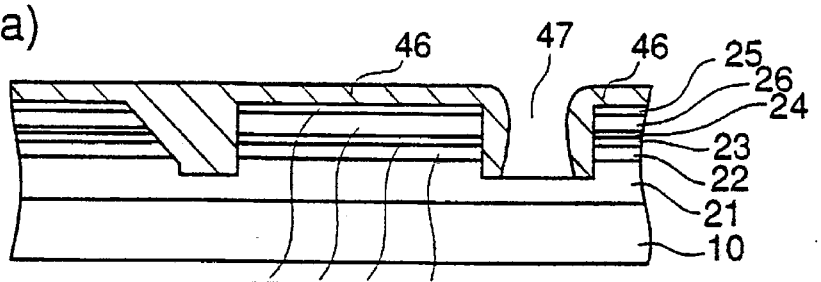
FIGS. 5(a)-5(f) are diagrams showing a part of the manufacturing process for the high output semiconductor laser device shown in FIG. 1.
Figure 5:
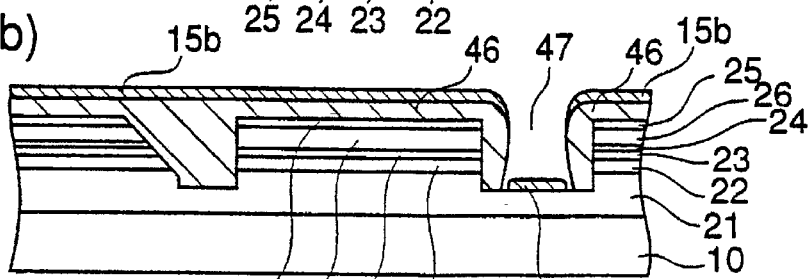
Figure 5:
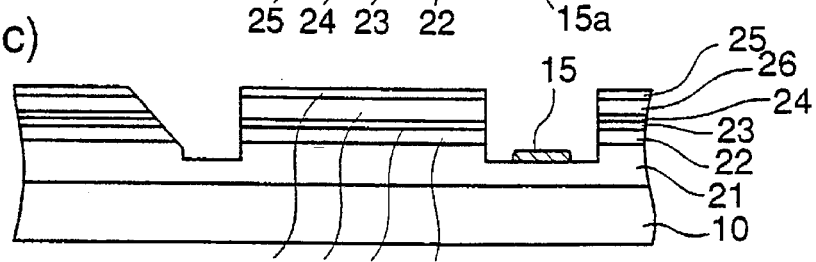
Figure 5:
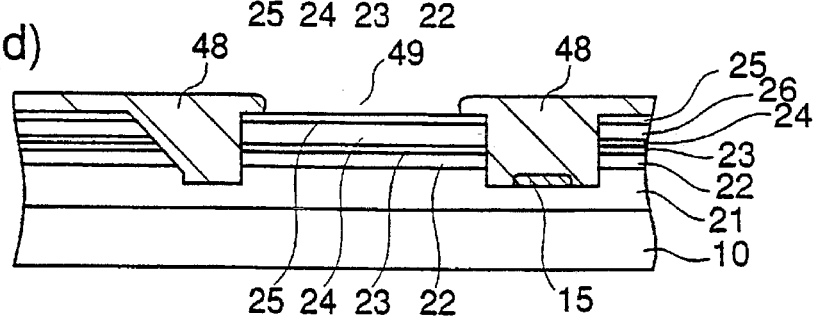
Figure 5:
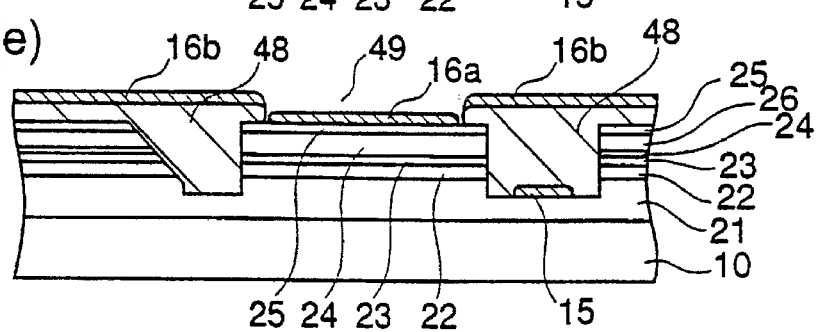
Figure 5:
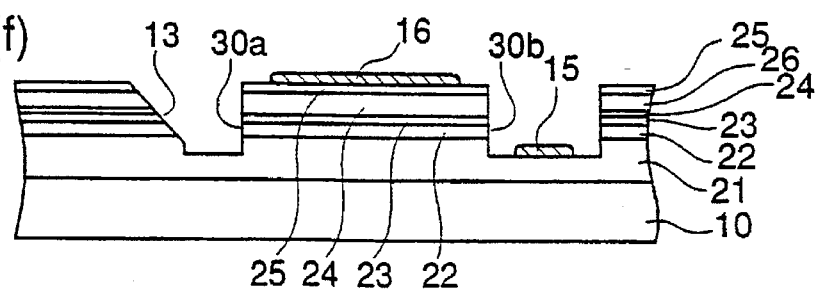

Then the formation of the n side metal electrode is carried out. After removal of the third resist 44, a fourth resist 46 is applied on the entire wafer and a window 47 is formed by transfer exposure in the vicinity of the center of the groove 28 formed for forming a rear facet of the laser device as shown in FIG. 5(a). Under such conditions metal evaporation is carried out and, as shown in FIG. 5(b), metal layer 15b is deposited on the n type GaAs layer 21 exposed in the window 47 and on the fourth resist 46. Thereafter, as shown in FIG. 5(c), the resist 46 is removed and the metal layer 15b deposited on the resist 46 is lifted off with the metal layer left only on the n type GaAs layer 21, thereby forming an n side electrode 15.

Then the formation of electrode on the upper surface of laser is carried out. The fifth resist 48 is applied on the entire wafer, and a window 49 is formed in the resist on the upper surface of the laser by exposure transfer as shown in FIG. 5(d). Metal evaporation is then carried out under such conditions, whereby metal layers 16a and 16b are deposited on the p type GaAs contact layer 25 exposed in the window 16a and 16b and on the fifth resist 48 as shown in FIG. 5(e). Thereafter, the resist 48 is removed and the metal layer 16b deposited on the resist 48 is lifted off with the metal layer 16b only left on the p type GaAs contact layer 25, as shown in FIG. 5(e), thereby forming a p side electrode 16.

The semiconductor laser device shown in FIG. 1 is completed by electrically connecting four lasers by means of the wires 17.

The operation of the laser device of embodiment 1 will be described. When voltage is applied via the wires 17, light is generated in the laser active region (active layer 23), the generated laser beam 31 is reflected by the light reflecting surface 13 and is emitted perpendicularly with respect to the wafer surface as shown in FIG. 2(a). That is, each laser acts as a surface light emitting laser. In this embodiment there are provided four surface emission lasers and these are arranged so that each light reflecting surface 13 is located at the center of the wafer. It is, therefore, possible to obtain about 4-fold optical power output as compared with a single surface light emitting laser. Here, the light reflecting surface 13 is arranged so that four light reflection surfaces are located in a region of 1 mm² in a case where the semiconductor laser device is used for, for example, a laser radar.

Figure 10:
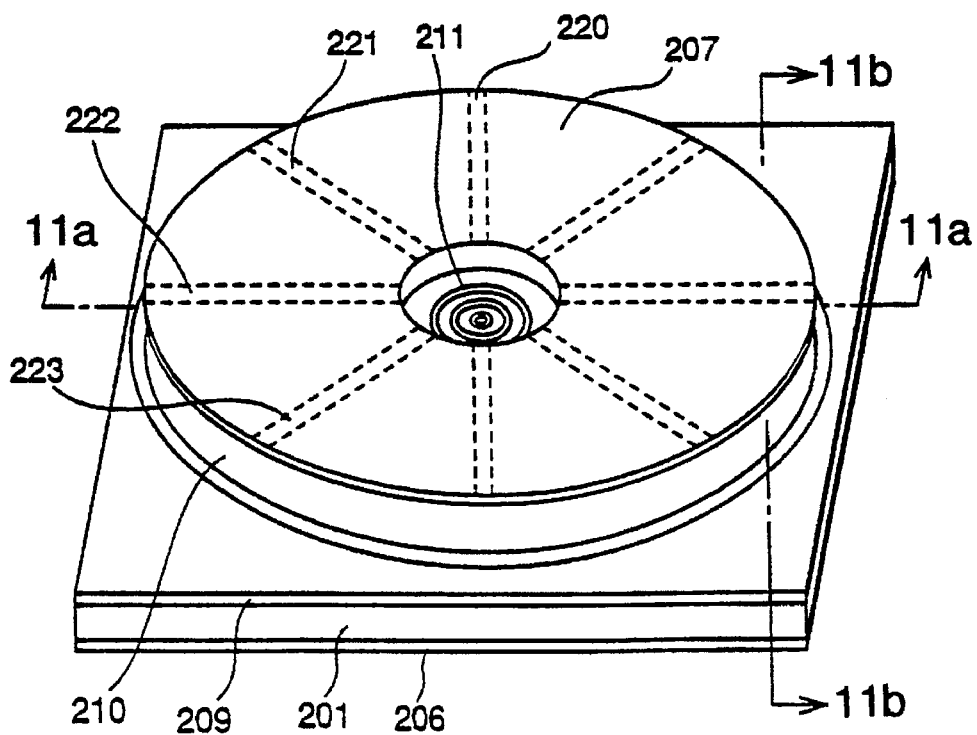
FIG. 10 is a perspective view showing a semiconductor laser device using a ring shaped secondary diffraction grating as another example of prior art high output semiconductor laser device.
Figure 11:
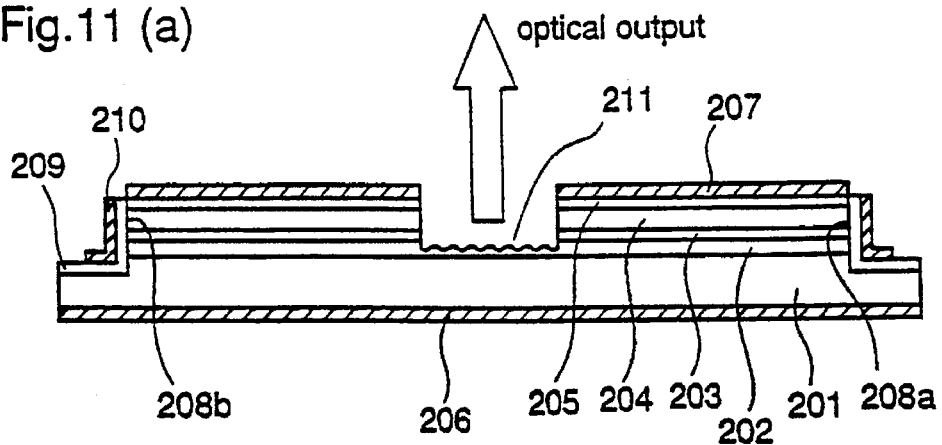
FIGS. 11(a) and 11(b) are sectional views taken along lines 11a—11a and 11b—11b of FIG. 10, respectively.
Figure 11:
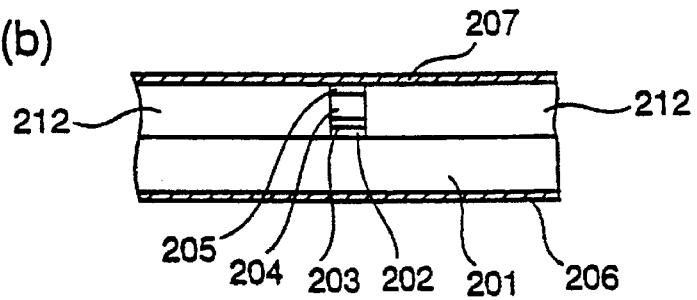

Since the arrangement of individual lasers is determined by the mask pattern when a laser device is fabricated by dry etching, its positional precision is higher than that of the semiconductor laser device with stacked lasers. In addition, the optical output of the laser beam emitted perpendicularly to the wafer surface by the light reflecting surface is 80–90% of the optical output of the Fabry-Perot type laser device, which is far larger than the optical output taken out by means of a secondary diffraction grating as in the prior art device shown in FIG. 10. Hence, according to the present embodiment a semiconductor laser device of far larger output as compared with the prior art device shown in FIG. 10 is obtained. Moreover, since the light reflecting surface 13 can be formed relatively easily by means of dry etching, its manufacture is extremely easy compared with the prior art device shown in FIG. 10 which requires preparation of a diffraction grating.

Embodiment 2

Figure 6:
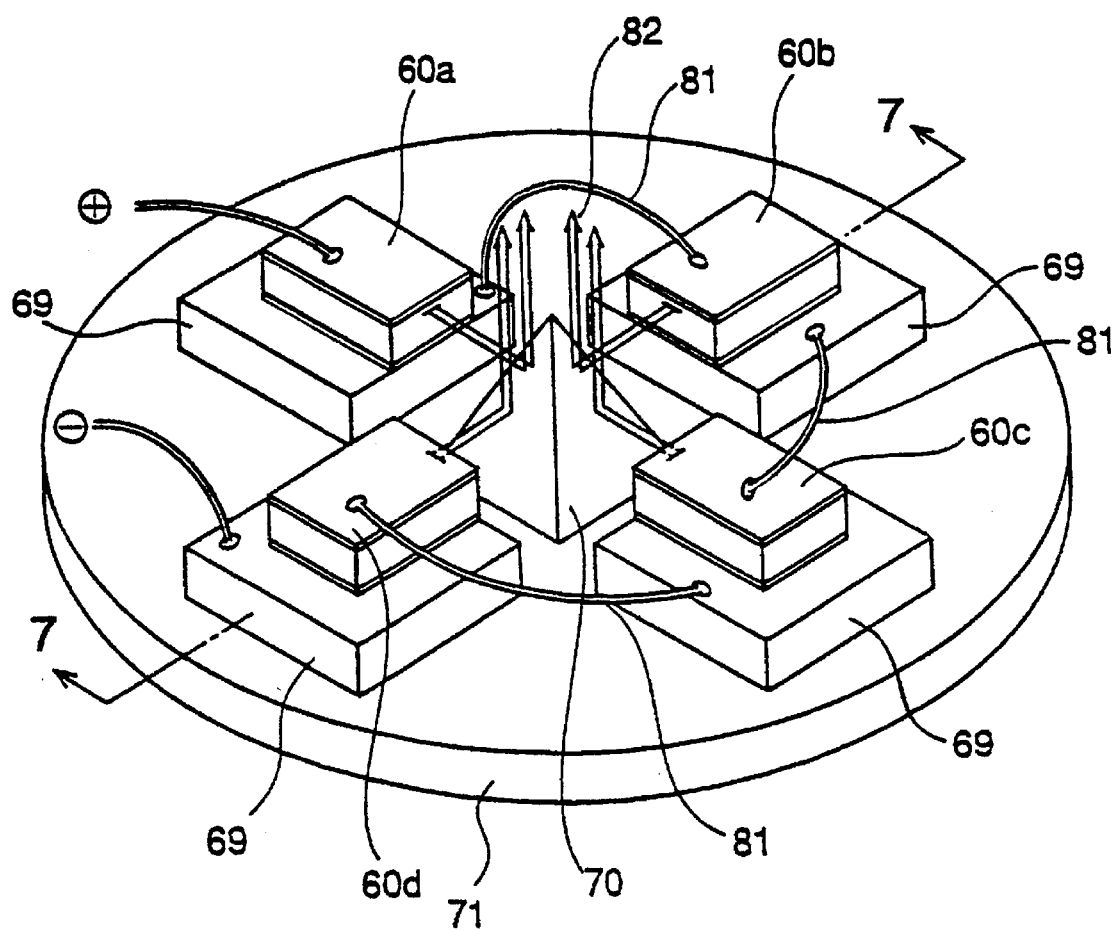
FIG. 6 is a perspective view showing a high output semiconductor laser device in accordance with a second embodiment of the invention.
Figure 7:
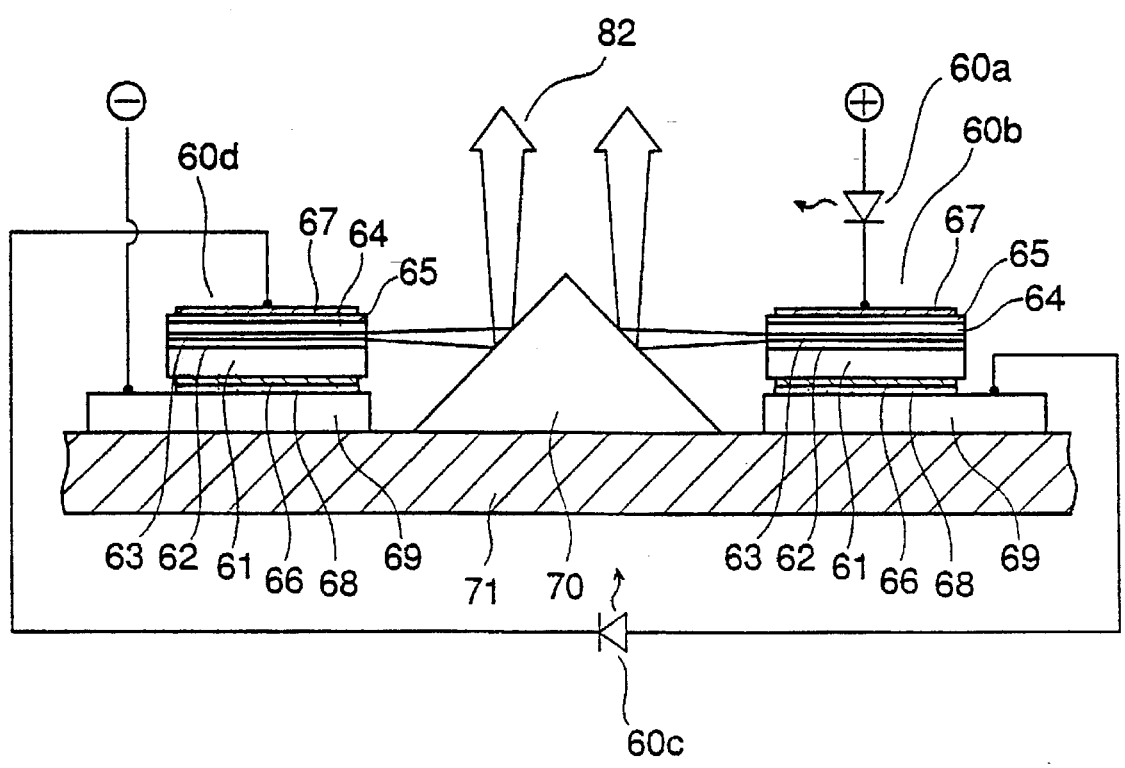
FIG. 7 is a sectional view taken along line 7—7 of FIG. 6.
Figure 8:
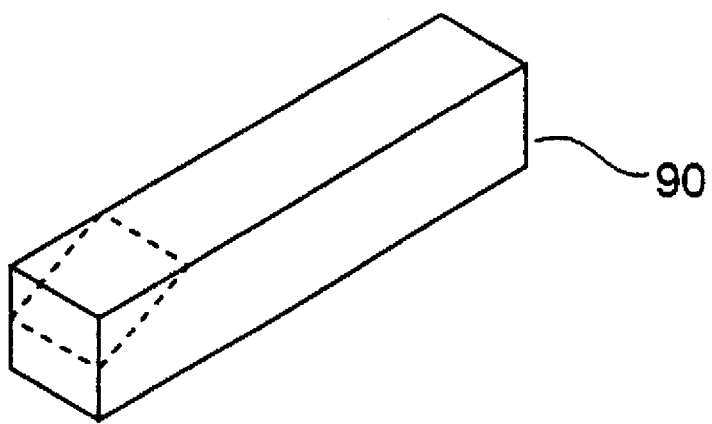
FIGS. 8(a)-8(d) are diagrams showing a part of the manufacturing process for the high output semiconductor laser device in accordance with the second embodiment of the invention.
Figure 8:
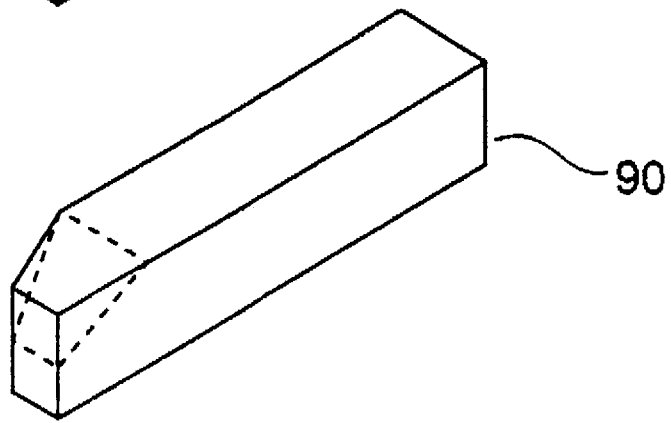
Figure 8:
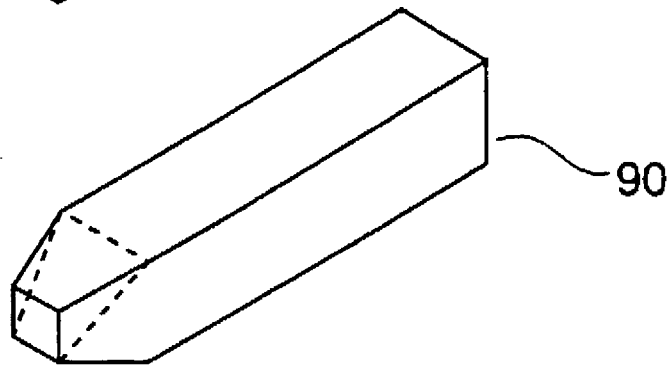
Figure 8:
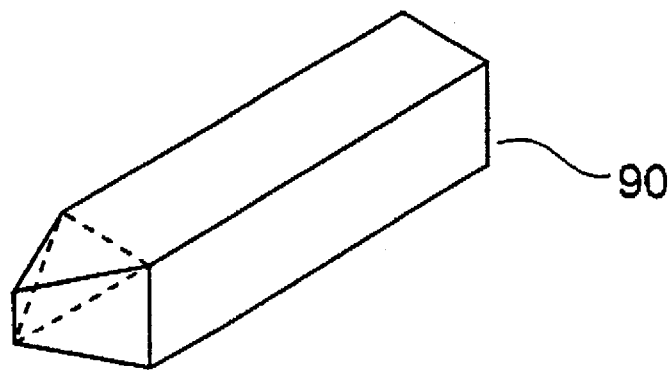
Figure 9:
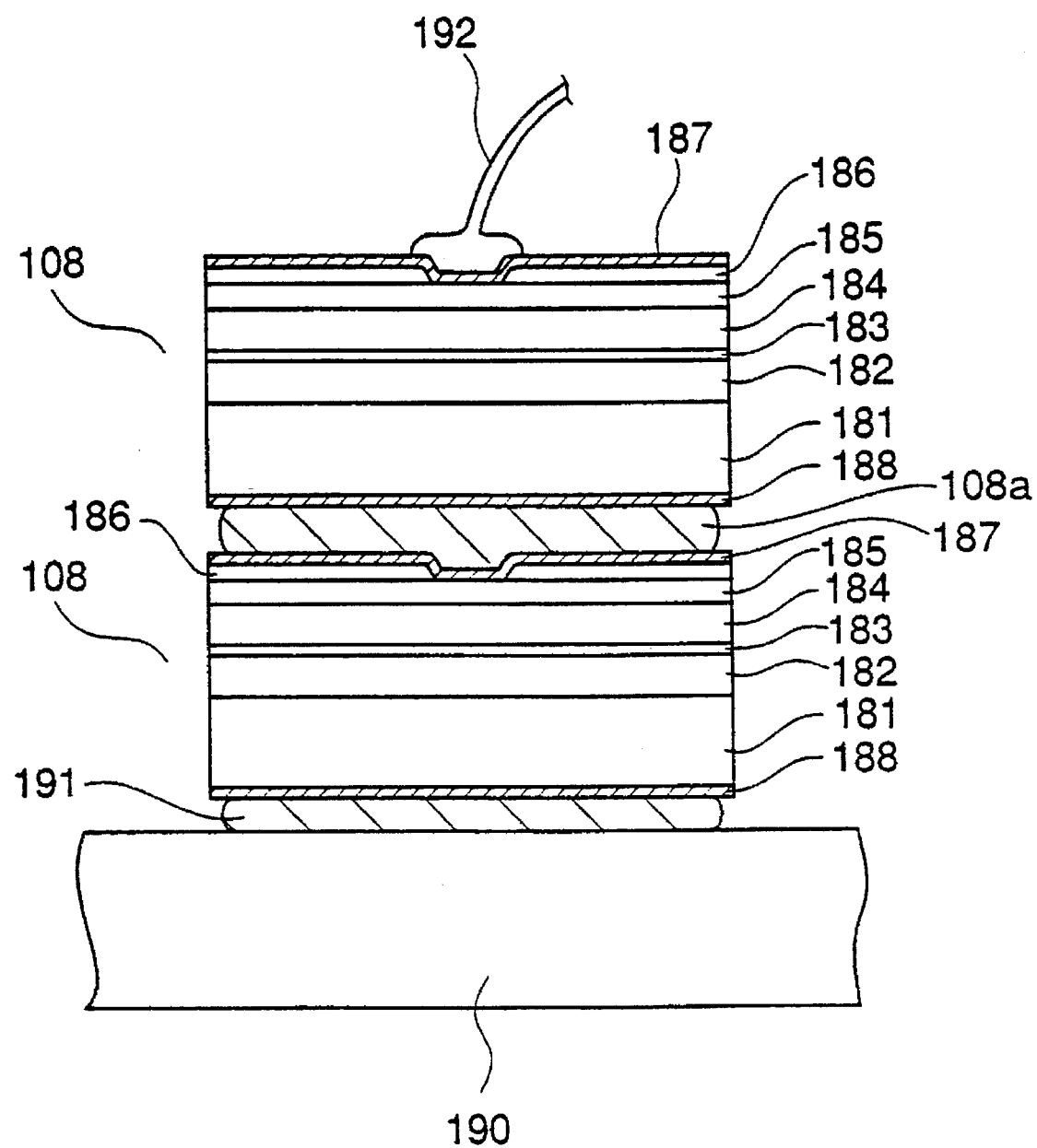
FIG. 9 is a view showing a semiconductor laser device formed in stacked fashion as an example of a prior art high output semiconductor laser.

A second embodiment of this invention will be explained. FIG. 6 is a schematic view showing a high power output semiconductor laser device in accordance with the second embodiment of the invention, and FIG. 7 is a partial sectional view taken along line 7—7 of FIG. 6.

In these figures reference numerals 60a, 60b, 60c and 60d designate semiconductor laser chips, which are mounted on the metallized surface of a silicon submount 69. The four semiconductor laser chips 60a, 60b, 60c and 60d mounted on the submount 69 are disposed radially with a reflection mirror 70 at the center. Each laser chip includes an n type AlGaAs lower cladding layer 62 3 μm thick, an AlGaAs active layer 63 10 nm (100 Å) thick, a p type AlGaAs upper cladding layer 64 3 μm thick, and a p type GaAs contact layer 65 1 μm thick successively epitaxially grown on an n type GaAs substrate 61 about 90 μm thick. The typical dimensions of the semiconductor laser chip are 600 μm in resonance length, 300 μm in width and 100 μm in thickness.

On the rear surface of the substrate 61 an n side metal electrode 66 (20 μm thick) is disposed, while there is disposed a p side metal electrode 67 (20 μm thick) on the surface of the contact layer 65. The semiconductor chip 60 and submount 69 are fixed together by means of solder 68. Reference numeral 81 designates a wire for connection of the laser p side electrode with the metallized layer deposited on the surface of the submount of an adjacent laser. Thus in this embodiment, serial connection of the individual laser elements such as a stacked type semiconductor laser device, is realized by connecting the p side electrode and the n side electrode of the adjacent laser elements by means of the wires 81.

The reflection mirror 70 is a square pyramid composed of silicon or the like about 2 mm square in the base and formed so that each of the light reflecting surfaces forms a 45° angle with respect to the surface of the base (horizontal plane). The reflection mirror 70 comprising a square pyramid can be prepared relatively easily by dry etching. For example, a square bar 90 of silicon about 2 mm square is prepared and it is rotated 90° respectively and the end portion of the bar 90 is formed by etching using an ion beam while the bar is rotated 90° at a time as illustrated in FIGS. 8(a) to 8(d). This formed end portion is cut off to form the reflection mirror 70.

The operation of the laser device of embodiment 2 will be described. When voltage is applied via wires 81, light is generated in the laser active region (active layer 63), the generated laser beam 82 is reflected by the reflecting surface of the reflection mirror 70 and, as shown in FIG. 7, and is emitted perpendicular to the wafer surface. This means that each laser acts as a surface light emitting laser. In this embodiment four Fabry-Perot type semiconductor lasers are radially arranged with the reflecting mirror 70 positioned at the center of the device. Therefore, it is possible to obtain about a 4-fold optical output compared with a single surface light emitting laser.

Further, since the individual lasers are only required to be die-bonded with their beam axes perpendicular to the reflecting surface of the reflection mirror 70, the aggregation of lasers can be worked out relatively easily and with an improved positional precision compared with stacked semiconductor laser device in which a plurality of laser chips are laminated together. In addition, the optical output of the laser beam emitted perpendicularly to the wafer surface by the reflecting surface of the reflection mirror 70 is 80–90% of the optical output of the Fabry-Perot type laser device, which is far larger than the optical output taken out by means of a secondary diffraction grating in the prior art device shown in FIG. 10. Hence, also in this embodiment, as in the first embodiment, a semiconductor laser device producing far higher output than the prior art device of FIG. 10 is obtained. Moreover, since the reflection mirror 70 can be formed relatively easily by means of dry etching as described above, its manufacture is extremely easy compared with that of the prior art device of FIG. 10 in which preparation of a diffraction grating is required.

What is claimed is:

1. A semiconductor laser device comprising:

an electrically insulating substrate having a surface;

a plurality of semiconductor layers epitaxially grown on the surface of the substrate including first cladding, active, and second cladding layers forming a semiconductor laser structure;

at least one groove transverse to the substrate and extending through the plurality of semiconductor layers into the substrate, dividing the semiconductor laser structure into at least two mutually isolated parts;

a respective first groove in each of the parts, including a first sidewall transverse to the surface of the substrate and forming a first facet of a respective semiconductor laser; and a respective second groove in each of the parts, including a second sidewall transverse to the surface of the substrate, opposite the first sidewall, and forming a second facet of the respective semiconductor laser in that part, each second groove being disposed along a respective radius extending from a common point on the surface of the substrate and including a third sidewall oblique to the surface of the substrate and opposite the second sidewall for reflecting light from the respective laser emitted through the second sidewall transverse to the surface of the substrate whereby light from each semiconductor laser is emitted along a single axis transverse to the surface of the substrate.

2. The semiconductor laser device of claim 1 wherein the semiconductor lasers are connected in series to each other.

* * * * *